United States Patent
London

(10) Patent No.: US 7,902,695 B2
(45) Date of Patent: Mar. 8, 2011

(54) BIPOLAR PULSE GENERATORS WITH VOLTAGE MULTIPLICATION AND PULSE SEPARATION

(75) Inventor: Simon London, Rockville, MD (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 51 days.

(21) Appl. No.: 12/404,101

(22) Filed: Mar. 13, 2009

(65) Prior Publication Data

US 2010/0231318 A1 Sep. 16, 2010

(51) Int. Cl.
*H03K 3/53* (2006.01)
*H03K 3/021* (2006.01)

(52) U.S. Cl. .................................................... 307/106
(58) Field of Classification Search ............... 307/106
See application file for complete search history.

(56) References Cited

U.S. PATENT DOCUMENTS

| | | | |
|---|---|---|---|
| 2,769,101 A | | 10/1956 | Drosd |
| 5,331,213 A | * | 7/1994 | Ohmori et al. ............... 307/108 |
| 6,214,297 B1 | | 4/2001 | Zhang et al. |
| 7,365,615 B2 | * | 4/2008 | Zucker et al. ................. 333/20 |
| 7,443,103 B2 | * | 10/2008 | Li et al. ..................... 315/209 R |
| 7,518,464 B2 | * | 4/2009 | London ......................... 333/20 |
| 7,583,159 B2 | * | 9/2009 | London ......................... 333/20 |
| 7,633,182 B2 | * | 12/2009 | London ......................... 307/106 |
| 2005/0174715 A1 | | 8/2005 | Yampolsky |
| 2006/0279372 A1 | | 12/2006 | Zucker et al. |
| 2007/0040623 A1 | | 2/2007 | London |
| 2007/0165839 A1 | | 7/2007 | London |
| 2010/0001807 A1 | * | 1/2010 | London et al. ................ 333/20 |
| 2010/0026101 A1 | * | 2/2010 | London ......................... 307/106 |

FOREIGN PATENT DOCUMENTS

SU 1098502 A1 9/1996

OTHER PUBLICATIONS

Specification and drawings of unpublished related co-pending U.S. Appl. No. 12/404,061, filed Mar. 13, 2009; "High Power Bipolar Pulse Generators"; Simon Y. London.; pp. 1-16, drawings 1-13.
"Modeling of Wound Coaxial Blumlein Pulsers", by Jose O. Rossi et al:, published in IEEE Transactions on Plasma Science, vol. 34, No. 5, Oct. 2006. Cited in spec. in unpublished related co-pending U.S. Appl. No. 12/404,061, filed Mar. 13, 2009.
"Design of a 150kV, 300A, 100Hz Blumlein Coaxial Pulser for Long Pulse Operation", by J.O. Rossi et al, presented in IEEE Transactions on Plasma Science, vol. 30, No. 5, Oct. 2002. Cited in spec.in unpublished related co-pending U.S. Appl. No. 12/404,061, filed Mar. 13, 2009.

(Continued)

*Primary Examiner* — Fritz M Fleming
*Assistant Examiner* — Adi Amrany
(74) *Attorney, Agent, or Firm* — Rossi, Kimms & McDowell; Marc A. Rossi

(57) ABSTRACT

A bipolar pulse generator includes a pair of two-conductor transmission lines coupled together with a load positioned between the two transmission lines. Two segments of one transmission line are charged and switchably coupled to two segments of the other transmission line to produce a bipolar pulse on the matched load. The generator may include two transmission line structures coupled together with a load positioned between each transmission line structures. The first transmission line structure may include a stepped transmission line and an embedded transmission line segment. A switch is coupled between the embedded transmission line segment and another segment of the transmission line structure. During operation, the first transmission line structure is charged to a potential with the switch in the open position and, when the switch is closed, the charge on the first transmission line structure together with the second transmission line structure generates a bipolar pulse on the matched load.

19 Claims, 14 Drawing Sheets

OTHER PUBLICATIONS

"A Combined High-Voltage, High-Energy Pulse Generator", by S.J. Macgregor et al. published in "Meas. Sci. Technol" 5 (1994), pp. 1580-1582. Cited in spec. in unpublished related co-pending U.S. Appl. No. 12/404,061, filed Mar. 13, 2009.

"A Novel HV Double Pulse Modulator", by S.J. Macgregor et al. published in "Meas. Sci. Technol" 5(1994), pp. 1407-1408. Cited in spec. in unpublished related co-pending U.S. Appl. No. 12/404,061, filed Mar. 13, 2009.

"A PFN Marx Generator Based on High-Voltage Transmission Lines", by S.M.Turnball et al., presented in Meas. Sci. Technol.11 (2000) N51-N55.Cited in spec. in unpublished related co-pending U.S. Appl. No. 12/404,061, filed Mar. 13, 2009.

"Design of Bipolar Pulse Generator for Ferroelectric Electron Emission Extraction", by Feng Chen et al., Pulsed Power IEE Symposium, 2000. Cited in spec.

* cited by examiner

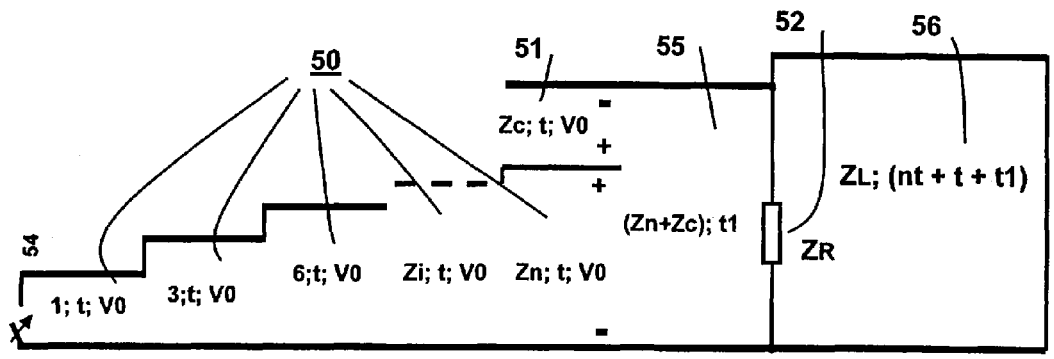
Fig. 13a
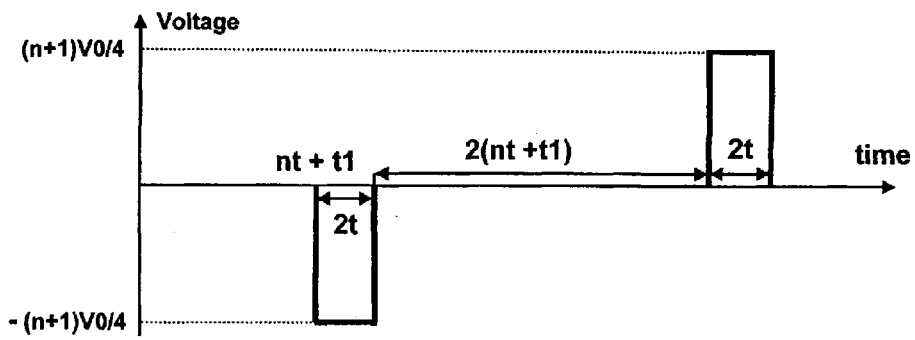
Fig. 13b
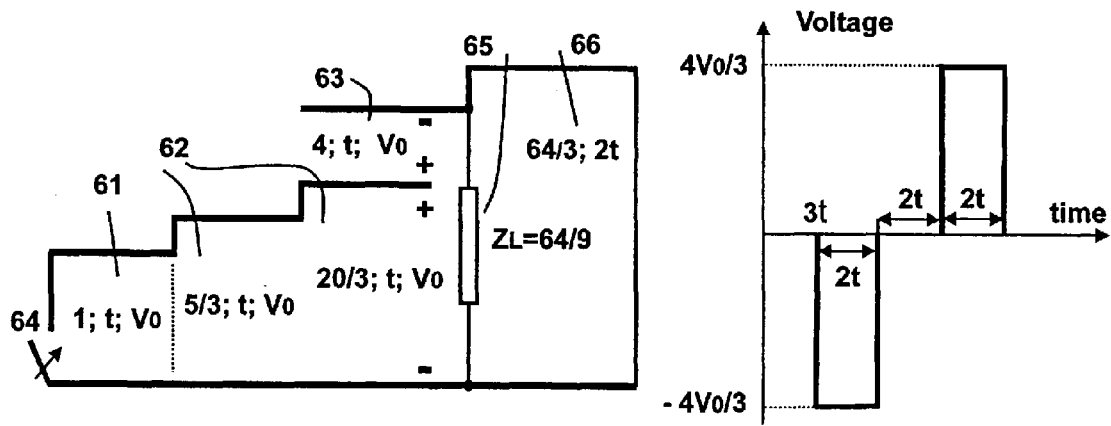
Fig. 14a
Fig. 14b

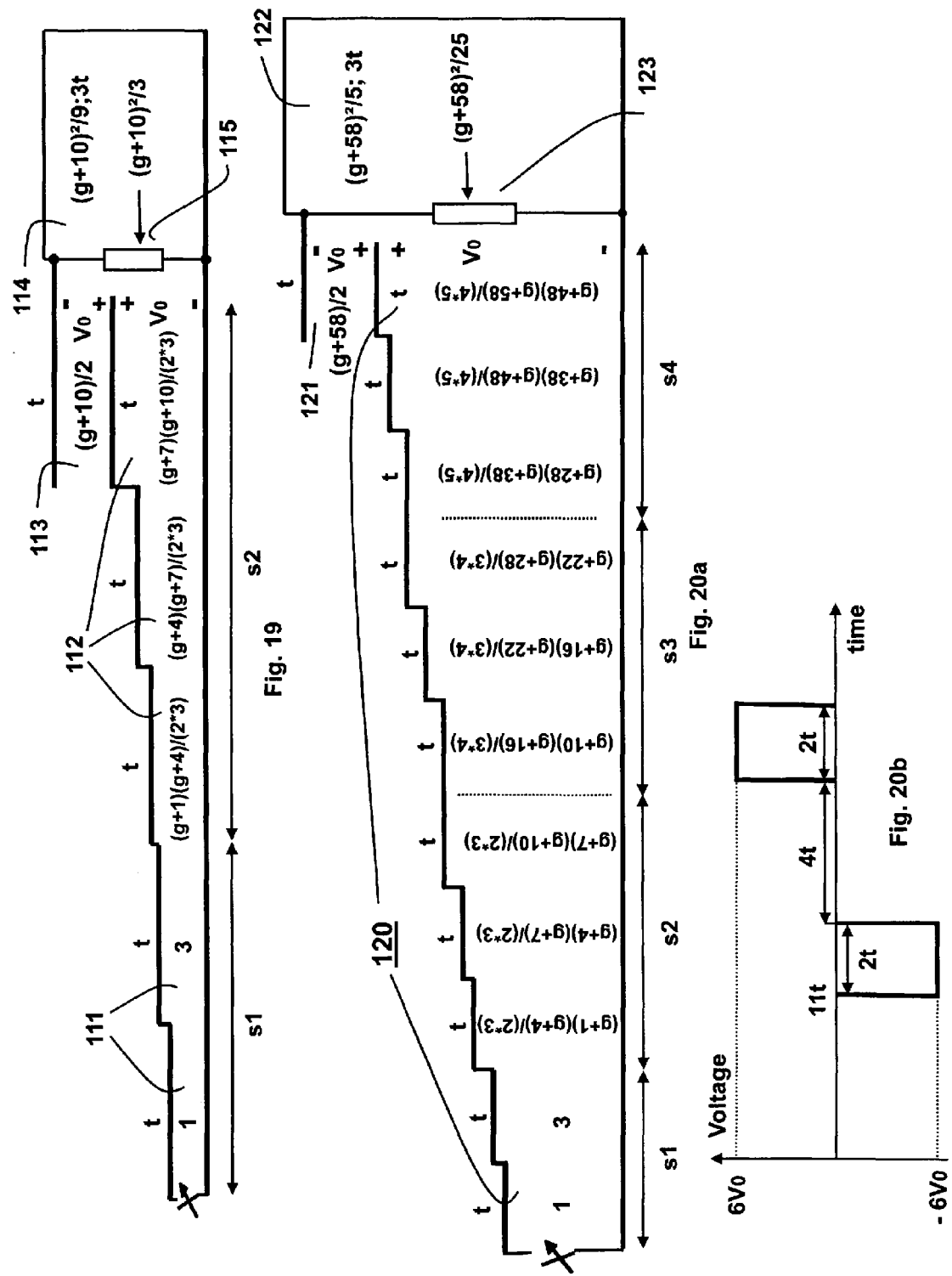

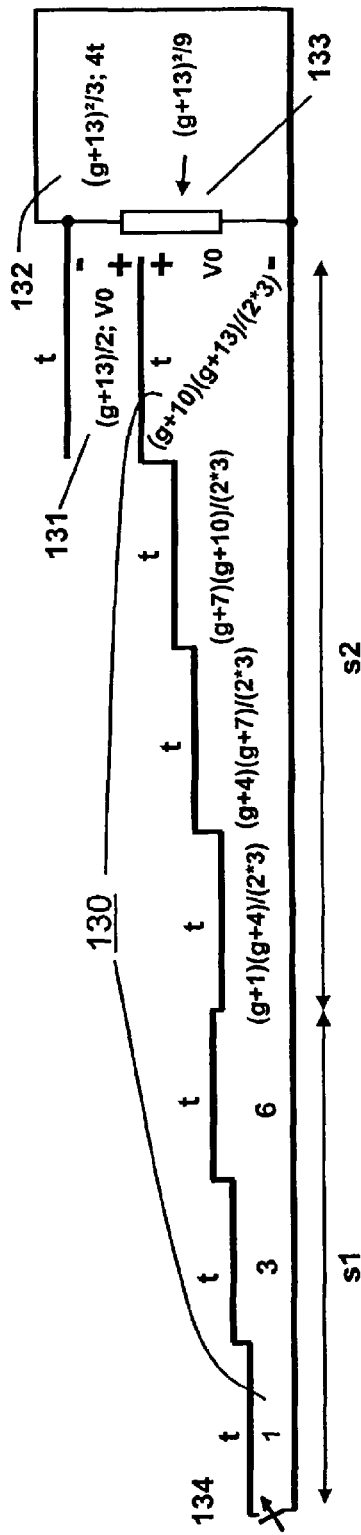

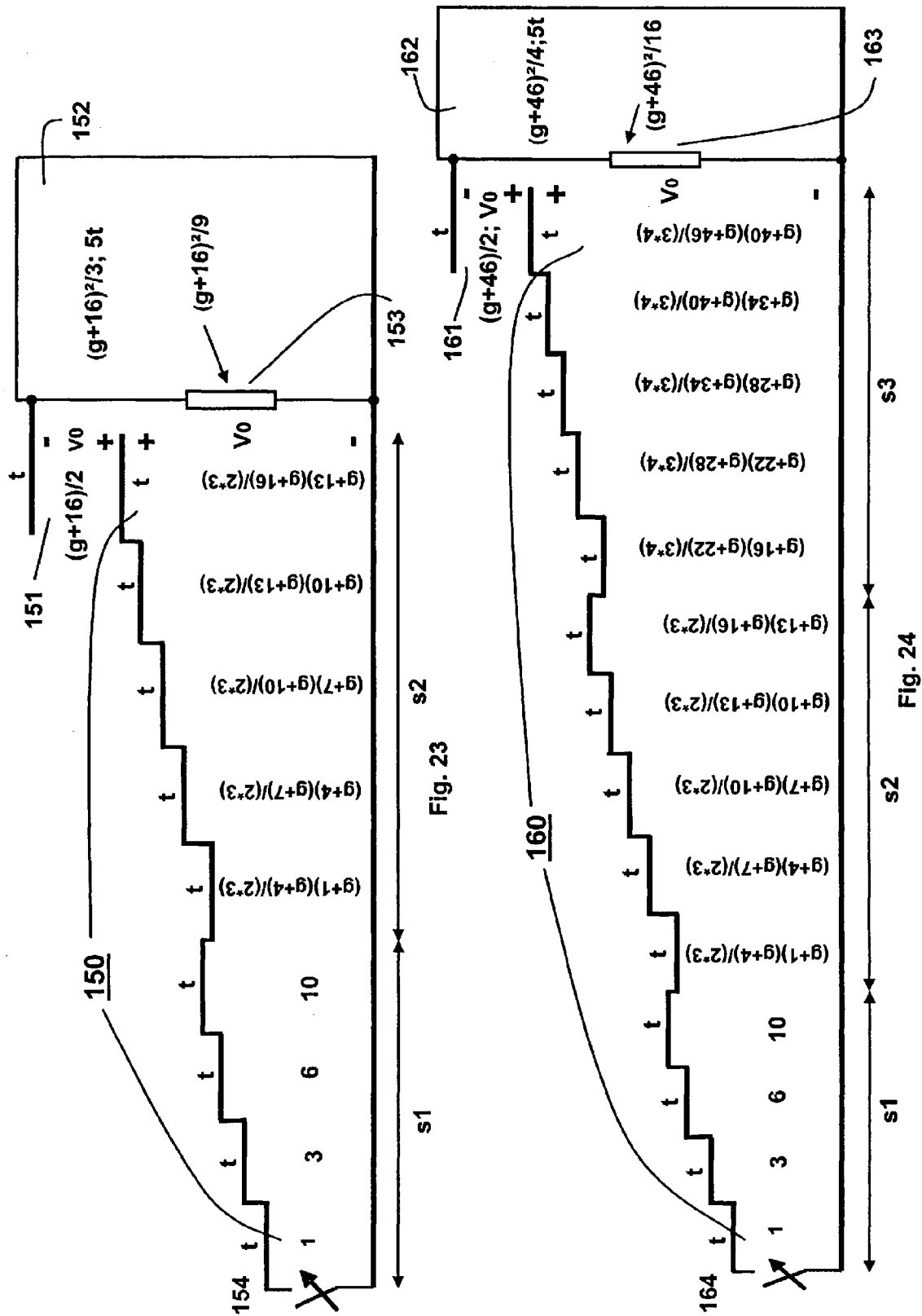

| g | Stages | Stage 1 (s=1) | Stage 2 (s = 2) | Stage 3 (s = 3) | Stage 4 (s = 4) | Stage 5 (s = 5) | Stage 6 (s = 6) |
|---|---|---|---|---|---|---|---|
| 1 | $Z_{st}*[s*(s+1)]$ | $i*(i+1)$<br>$i = 1$ | $(g+1)*(g+4)$<br>$(g+4)*(g+7)$ | $(g+7)*(g+13)$<br>$(g+13)*(g+19)$ | $(g+19)*(g+29)$<br>$(g+29)*(g+39)$ | $(g+39)*(g+54)$<br>$(g+54)*(g+69)$ | $(g+69)*(g+90)$<br>$(g+90)*(g+111)$ |
| 1 | $Z_C$ | $(g+1)/2$ | $(g+7)/2$ | $(g+19)/2$ | $(g+39)/2$ | $(g+69)/2$ | $(g+111)/2$ |
| 1 | $Z_R*(s+1)^2$ | $(g+1)^2$ | $(g+7)^2$ | $(g+19)^2$ | $(g+39)^2$ | $(g+69)^2$ | $(g+111)^2$ |
| 1 | $Z_L*(s+1)$ | $(g+1)^2$ | $(g+7)^2$ | $(g+19)^2$ | $(g+39)^2$ | $(g+69)^2$ | $(g+111)^2$ |
| 2 | $Z_{st}*[s*(s+1)]$ | $i*(i+1)$<br>$i = 1, 2$ | $(g+1)*(g+4)$<br>$(g+4)*(g+7)$<br>$(g+7)*(g+10)$ | $(g+10)*(g+16)$<br>$(g+16)*(g+22)$<br>$(g+22)*(g+28)$ | $(g+28)*(g+38)$<br>$(g+38)*(g+48)$<br>$(g+48)*(g+58)$ | $(g+58)*(g+73)$<br>$(g+73)*(g+88)$<br>$(g+88)*(g+103)$ | $(g+103)*(g+124)$<br>$(g+124)*(g+145)$<br>$(g+145)*(g+166)$ |
| 2 | $Z_C$ | $(g+1)/2$ | $(g+10)/2$ | $(g+28)/2$ | $(g+58)/2$ | $(g+103)/2$ | $(g+166)/2$ |
| 2 | $Z_R*(s+1)^2$ | $(g+1)^2$ | $(g+10)^2$ | $(g+28)^2$ | $(g+58)^2$ | $(g+103)^2$ | $(g+166)^2$ |
| 2 | $Z_L*(s+1)$ | $(g+1)^2$ | $(g+10)^2$ | $(g+28)^2$ | $(g+58)^2$ | $(g+103)^2$ | $(g+166)^2$ |
| 3 | $Z_{st}*[s*(s+1)]$ | $(i+0)*(i+1)$<br>$i = 1, 2, 3$ | $(g+1)*(g+4)$<br>$(g+4)*(g+7)$<br>$(g+7)*(g+10)$<br>$(g+10)*(g+13)$ | $(g+13)*(g+19)$<br>$(g+19)*(g+25)$<br>$(g+25)*(g+31)$<br>$(g+31)*(g+37)$ | $(g+37)*(g+47)$<br>$(g+47)*(g+57)$<br>$(g+57)*(g+67)$<br>$(g+67)*(g+77)$ | $g+77)*(g+92)$<br>$(g+92)*(g+107)$<br>$(g+107)*(g+122)$<br>$(g+122)*(g+137)$ | $g+137)*(g+158)$<br>$(g+158)*(g+179)$<br>$(g+179)*(g+200)$<br>$(g+200)*(g+221)$ |
| 3 | $Z_C$ | $(g+1)/2$ | $(g+13)/2$ | $(g+37)/2$ | $(g+77)/2$ | $(g+137)/2$ | $(g+221)/2$ |
| 3 | $Z_R*(s+1)^2$ | $(g+1)^2$ | $(g+13)^2$ | $(g+37)^2$ | $(g+77)^2$ | $(g+137)^2$ | $(g+221)^2$ |
| 3 | $Z_L*(s+1)$ | $(g+1)^2$ | $(g+13)^2$ | $(g+37)^2$ | $(g+77)^2$ | $(g+137)^2$ | $(g+221)^2$ |
| 4 | $Z_{st}*[s*(s+1)]$ | $i*(i+1)$<br>$i = 1, 2, 3, 4$ | $(g+1)*(g+4)$<br>$(g+4)*(g+7)$<br>$(g+7)*(g+10)$<br>$(g+10)*(g+13)$<br>$(g+13)*(g+16)$ | $(g+16)*(g+22)$<br>$(g+22)*(g+28)$<br>$(g+28)*(g+34)$<br>$(g+34)*(g+40)$<br>$(g+40)*(g+46)$ | $(g+46)*(g+56)$<br>$(g+56)*(g+66)$<br>$(g+66)*(g+76)$<br>$(g+76)*(g+86)$<br>$(g+86)*(g+96)$ | $(g+96)*(g+111)$<br>$(g+111)*(g+126)$<br>$(g+126)*(g+141)$<br>$(g+141)*(g+156)$<br>$(g+156)*(g+171)$ | $(g+171)*(g+192)$<br>$(g+192)*(g+213)$<br>$(g+213)*(g+234)$<br>$(g+234)*(g+255)$<br>$(g+255)*(g+276)$ |
| 4 | $Z_C$ | $(g+1)/2$ | $(g+16)/2$ | $(g+46)/2$ | $(g+96)/2$ | $(g+171)/2$ | $(g+276)/2$ |
| 4 | $Z_R*(s+1)^2$ | $(g+1)^2$ | $(g+16)^2$ | $(g+46)^2$ | $(g+96)^2$ | $(g+171)^2$ | $(g+276)^2$ |
| 4 | $Z_L*(s+1)$ | $(g+1)^2$ | $(g+16)^2$ | $(g+46)^2$ | $(g+96)^2$ | $(g+171)^2$ | $(g+276)^2$ |

Fig. 25

| g | Stages | Stage 7 (s =7) | Stage 8 (s = 8) | Stage 9 (s = 9) | Stage 10 (s = 10) | Stage 11 (s = 11) |
|---|---|---|---|---|---|---|
| 1 | $Z_{st}*[s*(s+1)]$ | (g+111)*(g+139) | (g+167)*(g+203) | (g+239)*(g+284) | (g+329)*(g+384) | (g+439)*(g+505) |
| | | (g+139)*(g+167) | (g+54)*(g+239) | (g+13)*(g+329) | (g+29)*(g+439) | (g+505)*(g+571) |
| | $Z_C$ | (g+167)/2 | (g+239)/2 | (g+329)/2 | (g+439)/2 | (g+571)/2 |
| | $Z_R*(s+1)^2$ | (g+167)² | (g+239)² | (g+329)² | (g+439)² | (g+571)² |
| | $Z_L*(s+1)$ | (g+167)² | (g+239)² | (g+329)² | (g+439)² | (g+571)² |
| 2 | $Z_{st}*[s*(s+1)]$ | (g+166)*(g+194) | (g+250)*(g+286) | (g+358)*(g+403) | (g+493)*(g+548) | (g+658)*(g+724) |
| | | (g+194)*(g+222) | (g+286)*(g+322) | (g+403)*(g+448) | (g+548)*(g+603) | (g+724)*(g+790) |
| | | (g+222)*(g+250) | (g+322)*(g+358) | (g+448)*(g+493) | (g+603)*(g+658) | (g+790)*(g+856) |
| | $Z_C$ | (g+250)/2 | (g+358)/2 | (g+493)/2 | (g+658)/2 | (g+856)/2 |
| | $Z_R*(s+1)^2$ | (g+250)² | (g+358)² | (g+493)² | (g+658)² | (g+856)² |
| | $Z_L*(s+1)$ | (g+250)² | (g+358)² | (g+493)² | (g+658)² | (g+856)² |
| 3 | $Z_{st}*[s*(s+1)]$ | g+221)*(g+249) | (g+305)*(g+369) | (g+477)*(g+522) | (g+657)*(g+712) | g+877)*(g+943) |
| | | (g+249)*(g+277) | (g+369)*(g+405) | (g+522)*(g+567) | (g+712)*(g+767) | (g+943)*(g+1009) |
| | | (g+277)*(g+305) | (g+405)*(g+441) | (g+567)*(g+612) | (g+767)*(g+822) | (g+1009)*(g+1075) |
| | | (g+305)*(g+333) | (g+441)*(g+477) | (g+612)*(g+657) | (g+822)*(g+877) | (g+1075)*(g+1141) |
| | $Z_C$ | (g+333)/2 | (g+477)/2 | (g+657)/2 | (g+877)/2 | (g+1141)/2 |
| | $Z_R*(s+1)^2$ | (g+333)² | (g+477)² | (g+657)² | (g+877)² | (g+1141)² |
| | $Z_L*(s+1)$ | (g+333)² | (g+477)² | (g+657)² | (g+877)² | (g+1141)² |
| 4 | $Z_{st}*[s*(s+1)]$ | (g+276)*(g+304) | (g+416)*(g+452) | (g+596)*(g+641) | (g+821)*(g+876) | (g+1096)*(g+1162) |
| | | (g+192)*(g+332) | (g+452)*(g+488) | (g+641)*(g+686) | (g+876)*(g+931) | (g+1062)*(g+1228) |
| | | (g+213)*(g+360) | (g+488)*(g+524) | (g+686)*(g+731) | (g+931)*(g+986) | (g+1228)*(g+1294) |
| | | (g+234)*(g+388) | (g+524)*(g+560) | (g+731)*(g+776) | (g+986)*(g+1041) | (g+1294)*(g+1360) |
| | | (g+255)*(g+416) | (g+560)*(g+596) | (g+776)*(g+821) | (g+1041)*(g+1096) | (g+1360)*(g+1426) |
| | $Z_C$ | (g+416)/2 | (g+596)/2 | (g+821)/2 | (g+1086)/2 | (g+1426)/2 |
| | $Z_R*(s+1)^2$ | (g+416)² | (g+596)² | (g+821)² | (g+1086)² | (g+1426)² |
| | $Z_L*(s+1)$ | (g+416)² | (g+596)² | (g+821)² | (g+1086)² | (g+1426)² |

Fig. 26

| g | Stages | Stage 1 (s=1) | Stage 2 (s=2) | Stage 3 (s=3) | Stage 4 (s=4) | Stage 5 (s=5) | Stage 6 (s=6) |
|---|---|---|---|---|---|---|---|
| 5 | $Z_{st}*[s*(s+1)]$ | $i*(i+1)$<br>$i=1,2,3,4,5$ | $(g+1)*(g+4)$<br>$(g+4)*(g+7)$<br>$(g+7)*(g+10)$<br>$(g+10)*(g+13)$<br>$(g+13)*(g+16)$<br>$(g+16)*(g+19)$ | $(g+19)*(g+25)$<br>$(g+25)*(g+31)$<br>$(g+31)*(g+37)$<br>$(g+37)*(g+43)$<br>$(g+43)*(g+49)$<br>$(g+49)*(g+55)$ | $(g+55)*(g+65)$<br>$(g+65)*(g+75)$<br>$(g+75)*(g+85)$<br>$(g+85)*(g+95)$<br>$(g+95)*(g+105)$<br>$(g+105)*(g+115)$ | $(g+115)*(g+130)$<br>$(g+130)*(g+145)$<br>$(g+145)*(g+160)$<br>$(g+160)*(g+175)$<br>$(g+175)*(g+190)$<br>$(g+190)*(g+205)$ | $(g+205)*(g+226)$<br>$(g+216)*(g+247)$<br>$(g+237)*(g+268)$<br>$(g+258)*(g+289)$<br>$(g+269)*(g+310)$<br>$(g+290)*(g+331)$ |
| | $Z_C$ | $(i+1)/2$ | $(g+19)/2$ | $(g+55)/2$ | $(g+115)/2$ | $(g+205)/2$ | $(g+331)/2$ |
| | $Z_R*(s+1)^2$ | $(i+1)^2$ | $(g+19)^2$ | $(g+55)^2$ | $(g+115)^2$ | $(g+205)^2$ | $(g+331)^2$ |
| | $Z_L*(s+1)$ | $(i+1)^2$ | $(g+19)^2$ | $(g+55)^2$ | $(g+115)^2$ | $(g+205)^2$ | $(g+331)^2$ |
| 6 | $Z_{st}*[s*(s+1)]$ | $i*(i+1)$<br>$i=1,2,3,4,$<br>$5,6$ | $(g+1)*(g+4)$<br>$(g+4)*(g+7)$<br>$(g+7)*(g+10)$<br>$(g+10)*(g+13)$<br>$(g+13)*(g+16)$<br>$(g+16)*(g+19)$<br>$(g+19)*(g+22)$ | $(g+22)*(g+28)$<br>$(g+28)*(g+34)$<br>$(g+34)*(g+40)$<br>$(g+40)*(g+46)$<br>$(g+46)*(g+52)$<br>$(g+52)*(g+58)$<br>$(g+58)*(g+64)$ | $(g+64)*(g+74)$<br>$(g+74)*(g+84)$<br>$(g+84)*(g+94)$<br>$(g+94)*(g+104)$<br>$(g+104)*(g+114)$<br>$(g+114)*(g+124)$<br>$(g+124)*(g+134)$ | $(g+134)*(g+149)$<br>$(g+149)*(g+164)$<br>$(g+164)*(g+179)$<br>$(g+179)*(g+194)$<br>$(g+194)*(g+209)$<br>$(g+209)*(g+224)$<br>$(g+224)*(g+239)$ | $(g+239)*(g+245)$<br>$(g+245)*(g+266)$<br>$(g+266)*(g+287)$<br>$(g+287)*(g+308)$<br>$(g+308)*(g+329)$<br>$(g+329)*(g+350)$<br>$(g+350)*(g+371)$ |
| | $Z_C$ | $(i+1)/2$ | $(g+22)/2$ | $(g+64)/2$ | $(g+134)/2$ | $(g+239)/2$ | $(g+371)/2$ |
| | $Z_R*(s+1)^2$ | $(i+1)^2$ | $(g+22)^2$ | $(g+64)^2$ | $(g+134)^2$ | $(g+239)^2$ | $(g+371)^2$ |
| | $Z_L*(s+1)$ | $(i+1)^2$ | $(g+22)^2$ | $(g+64)^2$ | $(g+134)^2$ | $(g+239)^2$ | $(g+371)^2$ |

Fig. 27

BIPOLAR PULSE GENERATORS WITH VOLTAGE MULTIPLICATION AND PULSE SEPARATION

BACKGROUND

The invention relates generally to bipolar pulse generators. More specifically, the invention relates to bipolar pulse generators that incorporate voltage multiplication (transformation) circuitry and time separation between positive and negative sub-pulses.

Recent development trends in pulse power microwave sources for a variety of applications have been directed to increasing power and efficiency as well as energy density (energy per volume). Transmission line type pulse generators with different kinds of fast switches, including light activated photoconductive switches, can achieve some of the best results. In particular, such transmission line type pulse generators are compact and provide a very fast pulse rise time and a very high power.

For a given limited charging voltage of transmission lines defined by high-current switches, high powered and high energy density transmission lines imply low characteristic impedances. The low range of characteristic impedances frequently causes problems for coupling with typically load impedances, for example 50 Ohm or higher, or radiating impedances, which introduces a problem with high ratio impedance transformation.

There are many different applications of bipolar pulse generators, for example, in industry, physics and medicine. Very often bipolar pulse generators with time separation between positive and negative sub-pulses are preferable or required. Bipolar pulse generators capable of separation between positive and negative sub-pulses are certainly known. Examples of such pulse generators are disclosed in "Design of Bipolar Pulse Generator for Ferroelectric Electron Emission Extraction", Feng Chen et al., Pulsed Power IEE Symposium, 2000, U.S. Pat. No. 6,214,297 issued to Zhang et al. entitled "High Voltage Pulse Generator", and SU Patent 1 254 994 A1 issued to Remnev G. E. et al. in 1994 entitled "Powerful Generator of Twin Pulses", the content of each of which is incorporated herein by reference.

There are, however, disadvantages associated with the above-referenced bipolar pulse generators. For example, all of the above-referenced generators do not provide voltage (impedance) transformation without an additional pulse transformer. In addition, the conventional pulse generators are general complex in nature, require more than one switch, and can be difficult to implement in real world applications, especially for high power applications. Still further, the switching elements required in U.S. Pat. No. 6,214,297 and SU Patent 1 254 994 A1 require very short (sub-nanosecond range) rise times, which are almost impossible to realize.

The present applicant has previously developed an efficient transmission line based pulse generator, which is described in US Patent Application 2007/165,839 entitled "Bipolar Pulse Generators with Voltage Multiplication", the content of which is incorporated herein by reference, which provides all required voltage/impedance transformation and high power pulses with a single switch. Any type of switch can be used in described pulse generator, including those in which it is necessary to generate nanosecond range pulses. Further, because only a single switch is utilized, there are no problems associated with switching time synchronization. The bipolar pulse generators in the above-referenced patent application, however, do not have any gap between positive and negative sub-pulses.

In all cases, energy stored in a voltage charged transmission line is proportional to the reverse value of line's characteristic impedance. In order to make a comparison of different generator's circuits, the total energy stored in all equally voltage charged transmission lines could be related to the energy stored in a transmission line with critical (minimum) characteristic impedance as a reference. The lower characteristic impedance implies the lower space between line's conductors and the higher electric field, which is a limitation for selected voltage defined by switch.

Accordingly, there remains a need for a bipolar pulse generator solution based on voltage charged transmission lines which provides separation between positive and negative sub-pulses, as well as a need for a bipolar pulse generator with pulse separation that provides high pulse power, and that also provides high voltage/impedance transformation.

In view of the above, it would be desirable to provide a bipolar pulse generator that can address the needs set forth above, that can be implemented in a simple transmission line structure with a single switch, which has a relatively small total size, and that allows simple access by fibers to a closing photoconductive switch(es) that actuates the bipolar pulse generator.

SUMMARY OF THE INVENTION

The invention provides a bipolar pulse generator based on voltage charged transmission lines, which provides a separation between positive and negative sub-pulses. The bipolar pulse generator also produces high pulse power while providing high voltage/impedance transformation. In addition, the bipolar pulse generator of the invention can be implemented in a simple structure with a single switch, has a relatively small total size, and allows simple access by fibers to a photoconductive switch(es) that can be used to actuate the bipolar pulse generator.

The bipolar pulse generator of the invention preferably includes a first voltage charged transmission line structure including a switch, a second non-charged transmission line structure, a load positioned in the second transmission line structure, and a voltage source that charges the first transmission line structure when the switch is in the open state. The bipolar pulse generator is activated and generates a bipolar pulse, including a separation or gap between a negative sub-pulse and a positive sub-pulse thereof, when the switch is closed.

In one preferred embodiment, the first transmission line structure includes a first transmission line, the second transmission structure includes a second transmission line connected to a third transmission line and the load is positioned between the second transmission line and the third transmission line of the second transmission line structure.

In a further embodiment, the first, second and third transmission lines are preferably composed of two conductor transmission lines, wherein a distal end of the first transmission line is coupled to a near end of the second transmission line, a distal end of the second transmission line is coupled to the load, a near end of the third transmission line is coupled to the load and a distal end of the third transmission line is short-circuited.

In another embodiment, the first transmission line structure includes a three conductor transmission line structure and the second transmission line structure includes a two conductor transmission line structure. The three conductor transmission line structure preferably includes a first conductor, a second conductor and a central conductor, wherein the first conductor and the central conductor comprises a first transmission line and the second conductor and the central conductor comprises a second transmission line, and wherein the switch is provided between first conductor and the central conductor of the first transmission line at a near end thereof.

Accordingly, in one embodiment, the invention provides a simple bipolar pulse generator that includes three two-conductor transmission lines coupled together with a load positioned between the second and the third non-charged transmission lines. Each conductor of a transmission line can be defined as a segment. The two-segment first transmission line is charged and switchably coupled to the two-segment second transmission line to produce a bipolar pulse on the matched load. The distant end of the third transmission line is short-circuited.

Accordingly, in another embodiment of the present invention, a bipolar pulse generator may include two transmission line structures coupled together with a load positioned between the two transmission line structures. The first charged transmission line structure may include an embedded (third) charged transmission line segment. A switch is coupled between a first (grounded) transmission line segment and the second transmission line segment of the transmission line structure at their near end. During operation, the second transmission line segment is charged equally with respect to the first and to the third segments of the first transmission line structure and the charging voltage exists on the open position switch. When the switch is closed the first transmission line structure starts to discharge and, with the second non-charged transmission line structure, generates a bipolar pulse on matched load with specified separation between positive and negative sub-pulses.

In another embodiment of the present invention, the bipolar pulse generator may further include a charged stepped transmission line between the switch at its near end and the embedded transmission line segment at its distant end that facilitates voltage/impedance transformation. The impedance of the stepped transmission line may increase for each successive step. Moreover, the load and the second transmission line structure may have impedances that are higher than the maximum characteristic impedance of the stepped transmission line.

According to still another embodiment of the present invention, the bipolar pulse generator may further include additional non-charged transmission line interconnected between a first (charged) transmission line structure and the load to provide specified separation (gap) between positive and negative sub-pulses.

The bipolar pulse generator according to the invention is useful in HPM generation, in particle accelerators and in other high voltage physical instruments and test equipments. These and other advantages and features of the invention will become apparent to those skilled in the art from the following detailed description of the preferred embodiments of the invention.

BRIEF DESCRIPTION OF THE DRAWINGS

The invention will be described with reference to certain preferred embodiments thereof and the accompanying figures, wherein:

FIG. 1b depicts an ideal pulse form provided by the generator illustrated in FIG. 1a;

FIG. 2b depicts an ideal pulse form on the load provided by the generator illustrated in FIG. 2a;

FIG. 3b depicts an ideal pulse form on the load provided by the generator illustrated in FIG. 3a;

FIG. 6b depicts an ideal pulse form provided by the generator illustrated in FIG. 6a;

FIG. 7b depicts an ideal pulse form provided by the generator illustrated in FIG. 7a;

FIG. 8b depicts an ideal pulse form provided by the generator illustrated in FIG. 8a.

FIG. 9b depicts an ideal pulse form provided by the generator illustrated in FIG. 9a.

FIG. 10b depicts an ideal pulse form provided by the generator illustrated in FIG. 10a;

FIG. 11b depicts an ideal pulse form provided by the generator illustrated in FIG. 11a.

FIG. 12b depicts an ideal pulse form provided by the generator illustrated in FIG. 12a;

FIG. 13a depicts a schematic of a single-stage, n-step bipolar pulse generator with limited by 2nt specified gap between sub-pulses according to an embodiment of the present invention;

FIG. 13b depicts an ideal pulse form provided by the generator illustrated in FIG. 13a;

FIG. 14a depicts a schematic of two-stage bipolar pulse generator with a gap equal to the length of sub-pulse according to an embodiment of the present invention;

FIG. 14b depicts an ideal pulse form provided by the generator illustrated in FIG. 14a;

FIG. 19 depicts a schematic of two-stage bipolar pulse generator with a gap equal to the length of two sub-pulses according to an embodiment of the present invention;

FIGS. 20a and 20b respectively depict a schematic of four-stage bipolar pulse generator with a gap equal to the length of two sub-pulses according to an embodiment of the present invention and resulting waveforms;

FIG. 21 depicts a schematic of two-stage bipolar pulse generator with a gap equal to the length of three sub-pulses according to an embodiment of the present invention;

FIG. 22 depicts a schematic of three-stage bipolar pulse generator with a gap equal to the length of three sub-pulses according to an embodiment of the present invention;

FIG. 23 depicts a schematic of two-stage bipolar pulse generator with a gap equal to the length of four sub-pulses according to an embodiment of the present invention;

FIG. 24 depicts a schematic of three-stage bipolar pulse generator with a gap equal to the length of four sub-pulses according to an embodiment of the present invention;

FIG. 25 presents the table of normalized characteristic impedances of transmission lines and load impedances for all combinations of values of gaps between sub-pulses (1, 2, 3, 4) and number of stages (1, 2, 3, 4, 5, 6) for bipolar pulse generators according to an embodiment of the present invention;

FIG. 26 presents the table of normalized characteristic impedances of transmission lines and load impedances for all combinations of values of gaps between sub-pulses (1, 2, 3, 4) and number of stages (7, 8, 9, 10, 11) for bipolar pulse generators according to an embodiment of the present invention; and FIG. 27 presents the table of normalized characteristic impedances of transmission lines and load impedances for all combinations of values of gaps between sub-pulses (5, 6) and number of stages (1, 2, 3, 4, 5, 6) for bipolar pulse generators according to an embodiment of the present invention.

DETAILED DESCRIPTION OF THE PREFERRED EMBODIMENTS

Figure 1A:
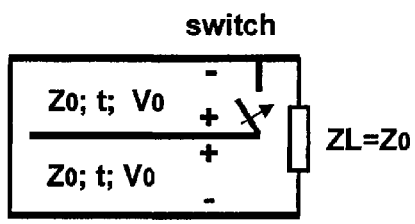
FIG. 1a depicts a schematic of a bipolar pulse generator according to the prior art with a switch positioned inside structure.
Figure 1B:
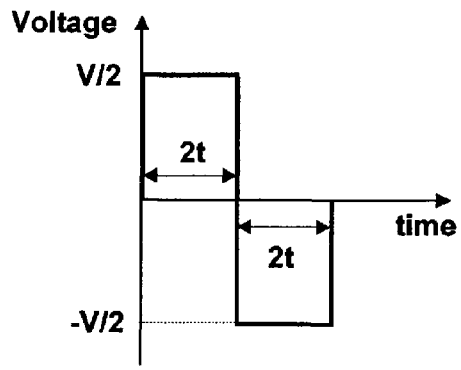
Figure 2A:
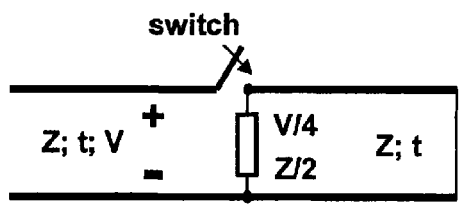
FIG. 2a depicts a simple schematic of a bipolar pulse generator according to the prior art with a switch that can be positioned outside structure.
Figure 2B:
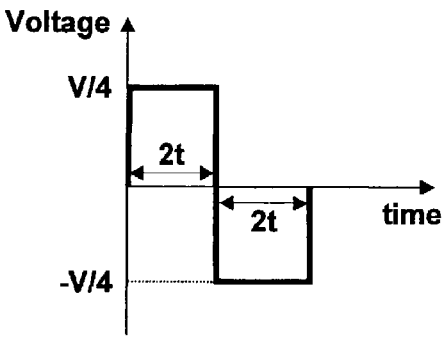
Figure 3A:
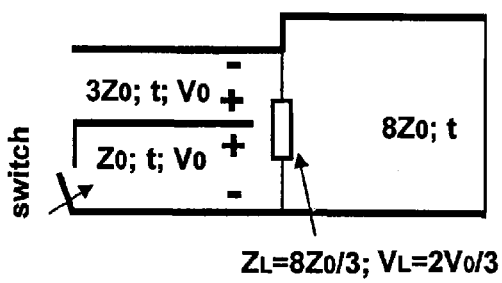
FIG. 3a depicts a schematic of a single-stage bipolar pulse generator according to the prior art with increased impedance transformation.
Figure 3B:
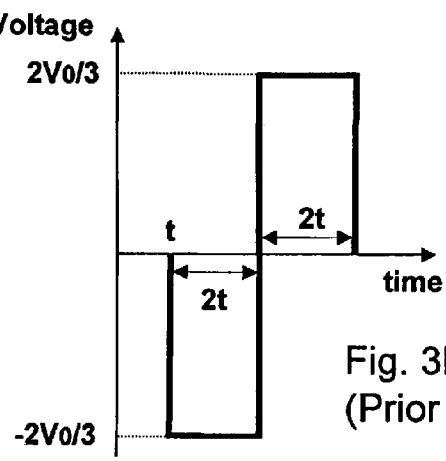
Figure 4:
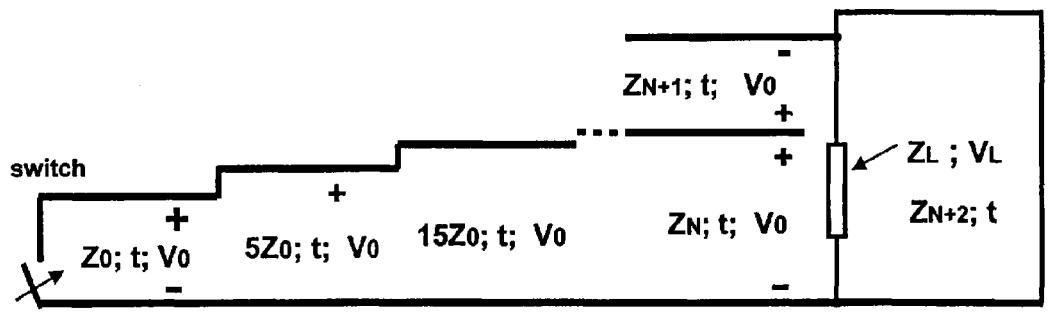
FIG. 4 depicts a schematic of an N-stage bipolar pulse generator according to the prior art with a charged stepped transmission line that provides high impedance and voltage transformation.
Figure 5:
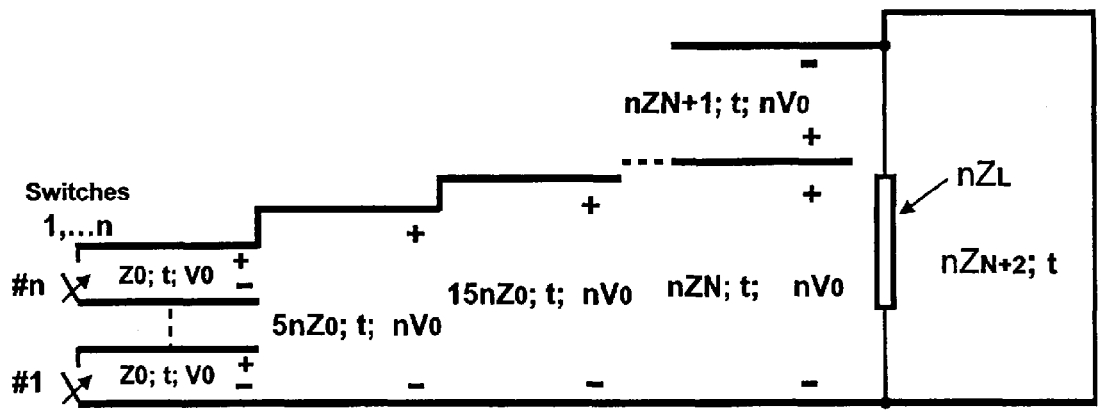
FIG. 5 depicts a schematic of an N-stage bipolar pulse generator according to the prior art with a charged stepped transmission line in which first stage consists of n identical switched stacked transmission lines in a first stage that provides increased power/energy and impedance transformation by a factor n.

FIGS. 1-5 illustrated various-ratio impedance transformed bipolar pulse generators according to the prior art. FIG. 1a, for example, illustrates a bipolar pulse generator with a switch positioned inside a structure. FIG. 2a depicts a schematic diagram of a simple bipolar pulse generator with a switch that can be positioned outside a structure. FIG. 3a depicts a schematic of a single-stage bipolar pulse generator with increased impedance transformation. FIG. 4 depicts a schematic of an N-stage bipolar pulse generator according to the prior art with a charged stepped transmission line that provides high impedance and voltage transformation. FIG. 5 depicts a schematic of an N-stage bipolar pulse generator with a charged stepped transmission line in which first stage consists of n identical switched stacked transmission lines in a first stage that provides increased power/energy and impedance transformation by a factor n. The illustrated generators generate bipolar pulses without gaps between the positive and negative sub-pulses with different amplitudes depending on number of charged transmission line steps.

Figure 6A:
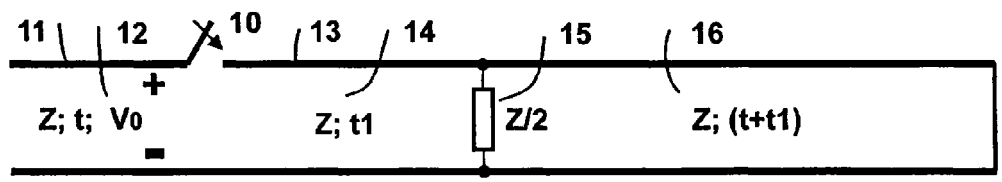
FIG. 6a depicts a simple structure of a bipolar pulse generator with any specified gap between sub-pulses according to an embodiment of the present invention.

In contrast to the pulse generators of the prior art, the present invention provides a pulse generator that generates bipolar pulses with separation or gaps in time between positive and negative sub-pulses. As shown in FIG. 6a, for example, a bipolar pulse generator is provided that includes three two-conductor transmission lines 12, 14 and 16 coupled together with a load 15 positioned between the second transmission line 14 and the third transmission lines 16. For the purposes of this discussion, the first transmission line 12, which is voltage charged, corresponds to a first transmission structure, and the second transmission line 14 and the third transmission line 16 both correspond to a second transmission line structure and are not charged. Further, each conductor of a transmission line will be termed a segment, with each transmission line including at least two conductors, i.e. two segments, in the illustrated embodiment.

As shown in FIG. 6a, a switch 10 couples a segment 11 of the first transmission line 12 to a segment 13 of the second transmission line 14. The second transmission line 14 is connected to the load 15 at an end opposite to the switch 10 (distal end) and to an end (near end) of the third transmission line 16. The transmission line 16 is short-circuited at a second end (distal end) opposite the end connected with the second transmission line 14. The illustrated bipolar pulse generator may be implemented in a flat or a folded design.

During operation, the first transmission line 12 is charged and is switchably coupled to the second transmission line 14 via the switch 10 to produce a bipolar pulse on the load 15. Initially, the switch 10 is open, which allows the two segments of first transmission line 12 to be charged by a voltage supply V0 as indicated in FIG. 6a. The switch 10 is subsequently closed, for example at time t0=0, which causes the discharge of transmission line 12 into the second (currently non-charged) transmission line structure, which includes the cascade-connected second transmission line 14 and third transmission line 16, with the load 15 positioned between second transmission line 14 and third transmission line 16. At the moment transmission line 12 with the characteristic impedance Z starts to discharge to the non-charged transmission line 14 with the same characteristic impedance Z, a pulse with magnitude V0/2 starts to propagate on transmission line 14 toward the load 15. At the same moment of time when the switch 10 is closed, the voltage at the end of transmission line 12 drops from V0 to V0/2. Accordingly, a reflected negative polarity pulse with magnitude −V0/2 starts to propagate on transmission line 12, with its time delay t toward its open end.

At time delay t1, after switching the positive pulse with magnitude V0/2 reaches the load 15 and sees the resulting load impedance, which is equal to parallel connection of load resistance Z/2 and characteristic impedance of the third transmission line 16 which is equal Z. The resulting load impedance is equal to Z/3 and, consequently, the reflection coefficient is equal to $(Z-Z/3)/(Z+Z/3)=\frac{1}{2}$, which means that the voltage on the load 15 and magnitude of forward wave that continues to propagate on the third transmission line 16 toward the short-circuited end is equal V0/4. The reflected wave, which starts to propagate on second transmission line 14 towards the closing switch 10 and to the open end of transmission line 12, is equal −V0/4. The voltage on the load 15, which is equal V0/4 starts at time delay t1 after switching and will be continual during the period of time 2t as illustrated on FIG. 6b. Therefore, at the moment of time t1+2t after switching, the voltage on the load 15 drops to zero. During the period 2t, halve of energy stored in transmission line 12 is dissipated on the load 15.

Figure 6B:
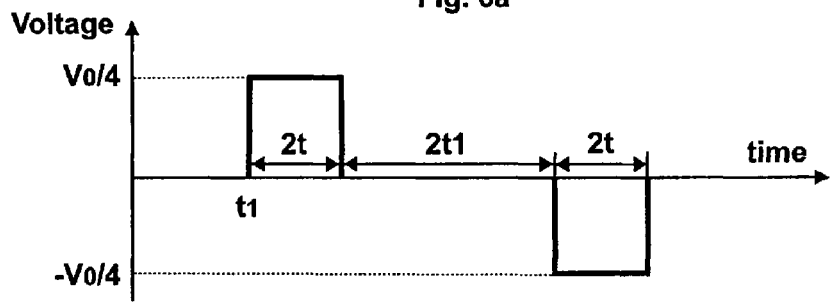

The voltage on the load 15 will be still equal zero during the time period 2t1 (double transient time of transmission line 14) before the two waves with equal negative magnitudes (−V0/4) arrives at the load 15. One wave with duration 2t is reflected from the short-circuited end of transmission line 16 with reversed polarity (from positive to negative). The second identical wave (also with negative polarity) is reflected at the same moment of time (t+2t1) after switching at the open end of transmission line 12 without changing polarity. Each wave transfers ¼ of the energy initially stored in transmission line 12. The load 15 is matched (non-reflected) load for each of those equal magnitude and negative polarity waves. Therefore, during additional time interval 2t, the negative polarity pulse (−V0/4) will be dissipated on the load 15 and no waves will be traveling on transmission lines after this time. The full energy initially stored in the first transmission line 12 is now dissipated on the load 15. FIG. 6b depicts resulting ideal pulse on the load.

The simple circuit illustrated in FIG. 6a is universal and valid for any values of t>0 and t1≧0. However, the generator according to FIG. 6a does not provide any impedance transformation and power/energy on the load is less than compared to what is possibly achievable.

Figure 7A:
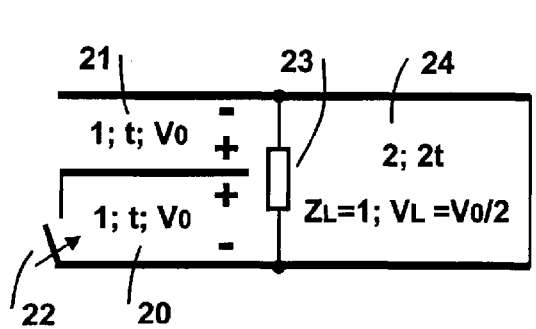
FIG. 7a depicts a schematic of a single-stage, single-step bipolar pulse generator with a gap between sub-pulses according to an embodiment of the present invention.

FIG. 7a depicts a single-stage bipolar pulse generator according to another embodiment of the present invention, wherein the gap between the positive and negative sub-pulses is equal to the length of sub-pulse. Referring to FIG. 7a, the first transmission line structure is a three conductor transmission line structure including a first conductor, a second conductor and a central conductor. The first conductor and the central conductor correspond to a first transmission line 20 and the second conductor and the central conductor correspond to a second transmission line 21, with a switch 22 connected to the first transmission line 20 a first end (near end) of the first transmission line structure. The first transmission line 20 and the second transmission line 21 have equal characteristic impedances and are charged to opposite polarities.

The output voltage of the first transmission line structure is connected to a second (non-charged) transmission line structure, which includes a non-charged third transmission line 24 short-circuited at an end (distal end) opposite to the end connected to the first transmission line structure. A load 23 is positioned between interconnected nodes of first transmission line structure and the second transmission line structure. The first transmission line 20 and the second transmission line 21, each with a normalized characteristic impedances equal to one (1), have the same time delay t. The third transmission line 24 has a normalized characteristic impedance equal to two (2) and a time delay equal 2t. The normalized resistive impedance of the load 23 is equal to one (1), and defined as a parallel connection of equal characteristic impedances: first transmission line structure (two series connected impedances of the first transmission line 20 and the second transmission line 21) and impedance of the third transmission line 24.

Figure 7B:
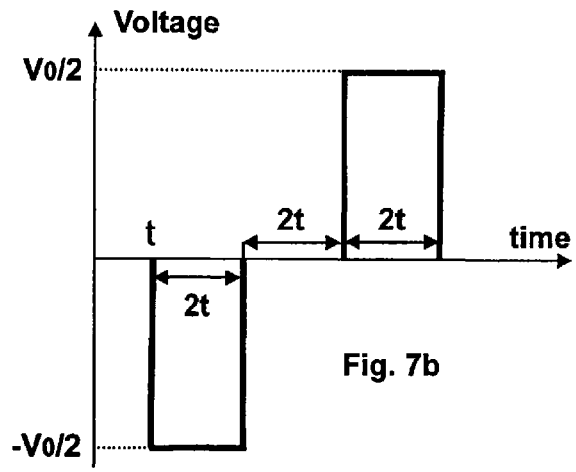

After closing switch 22, for example at time t0=0, a negative pulse with voltage (−V0) starts to propagate on the first transmission line 20 from the near end, where the voltage drops to zero toward its distal end. After a time delay t, the pulse reaches the distal end of transmission line 20 and summarized in-phase with charged voltage (−V0) on the transmission line 21. The resulting voltage (−2V0) as the output voltage of the first transmission line structure is applied to the parallel connected load 23 and the near end of third transmission line 24 which has its distal end short-circuited. The resulting normalized load impedance for the source, i.e. for the first transmission line structure (two series connected transmission lines 21 and 22), is equal to ⅔. With source voltage −2V0, normalized source impedance equal 2 and load impedance equal ⅔, the voltage on the load 23 is equal to −V0/2. The same magnitude −V0/2 voltage pulse also starts to propagate on the third transmission line 24 toward its short-circuited end. At the same time, the reflected positive voltage pulse 2V0−V0/2=3V0/2 divides equally between equal characteristic impedance's transmission lines 20 and 21, and starts to propagate as two 3V0/4 pulses toward the open end of the second transmission line 21 and toward the short-circuited (by switch 22) end of first transmission line 20. After time delay t, these pulses are reflected back. However, the pulse on transmission line 20 is reflected at the closing switch 22 with an opposite polarity. After additional time delay t, these two pulses reach the load 23 and now they are in-phase as one pulse with magnitude V0/2. At the same moment of time, another pulse traveling initially on the third transmission line 24 with magnitude (−V0/2) returns back to the load 23 as positive pulse V0/2 after reflection at short-circuited end of transmission line 24. For each these equal pulses with magnitude V0/2, the load 23 is a matched load (twice the load impedance) and in result a positive pulse with magnitude V0/2 will be on the load 23 during period of time 2t. FIG. 7b depicts resulting ideal pulse on the load.

The generator according to FIG. 7a, and all the following generators presented as embodiments of the present invention, generates pulse power on the load that exceeds by a factor of 1.5 the pulse power generated by the single-switch generator presented in mentioned above US Patent Application US2007/165839. The circuit shown on FIG. 7a can be modified to achieve any specified gap between sub-pulses which is longer than 2t.

Figure 8A:
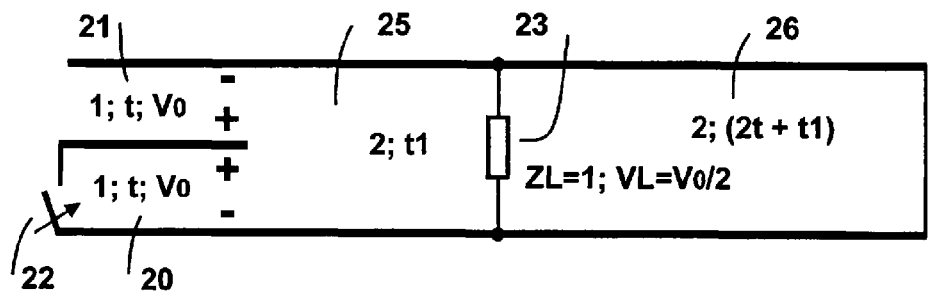
FIG. 8a depicts a schematic of a single-stage, single-step bipolar pulse generator with limited by 2t specified gap between sub-pulses according to an embodiment of the present invention.
Figure 8B:
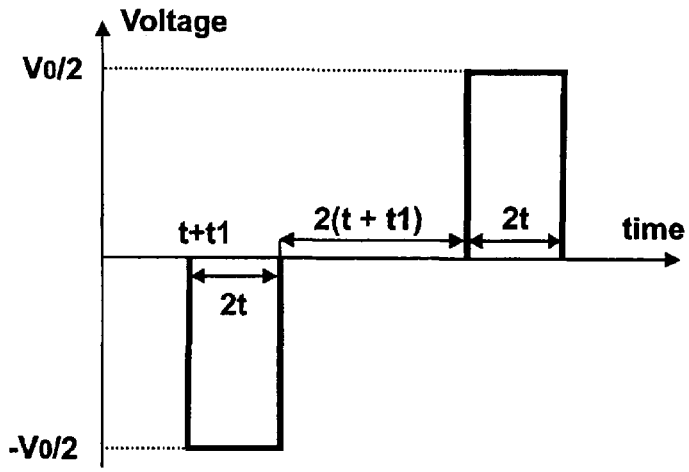

FIG. 8a illustrates a bipolar pulse generator in accordance with a further embodiment of the present invention. With respect to FIG. 7a, the embodiment of FIG. 8a includes an additional intermediate non-charged transmission line 25 in the second transmission structure with a specified time delay t1 and normalized characteristic impedance equal 2, which is the sum of normalized characteristic impedances of first and second transmission lines 20 and 21. In addition, the length of the third transmission line 26 is increased by t1 relative to third transmission line 24 illustrated in FIG. 7a. The wave's propagation process in the bipolar pulse generator illustrated in FIG. 8a in principle is the same as in the generator shown on FIG. 7a including only the additional effect of the time delay t1.

It is noted that the structure of FIG. 7a is a Blumlein pulse generator with an additional double length transmission line 24 connected to the load at its near end and short-circuited at its distant end. The impedance of load 23 is twice less than in a Blumlein pulse generator, and is equal to the impedance of parallel connected transmission line 24 with impedance of series connected transmission lines 20 and 21. In the case of these impedances and lengths, half of the energy stored in transmission lines 20 and 21 is delivered by the first sub-pulse, and the second half of energy is delivered by the second sub-pulse.

Figure 9A:
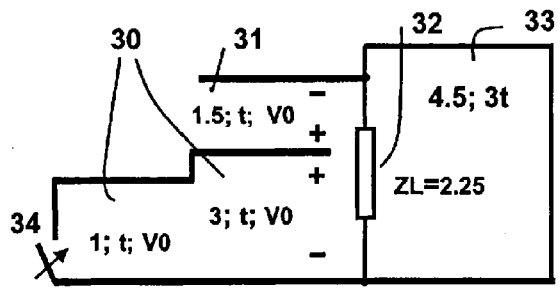
FIG. 9a depicts a schematic of a single-stage, two-step bipolar pulse generator with the gap between sub-pulses equal to the double length of sub-pulse according to an embodiment of the present invention.

It is well-known that a Blumlein generator is a single-step (particular case) of stepped-line Darlington unipolar pulse generator. FIG. 9a illustrates a bipolar pulse generator according to an embodiment of the present invention, which is a modified two-step Darlington generator with an additional transmission line 33 short-circuited at its distant end. By analogy with FIG. 7a, a characteristic impedance of transmission line 33 is equal to the sum of characteristic impedances of the transmission line 31 and a second-step line in a two-step transmission line 30. These lines are connected in series with respect to a load 32 and their resulting normalized impedance is equal to 4.5, which is equal to the impedance of transmission line 33 and is twice the impedance of the load 32. The electrical length of the transmission line 33, also by analogy with circuit FIG. 7a, is longer by time delay t than the electrical length (2t) of two-step Darlington structure (from switch 34 to the end of second step with normalized characteristic impedance equal 3).

Figure 9B:
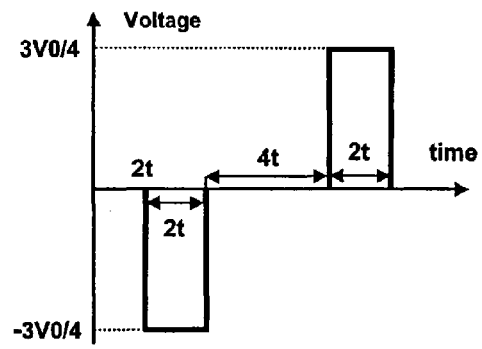

Analysis of the wave propagations on the two-step transmission line 30 and the transmission lines 31, 33 gives the resulting pulse on the load, which is illustrated on FIG. 9b. In this case also, half of the energy stored in the two-step transmission line 30 and the transmission line 31 is delivered to the load 32 by the first sub-pulse, and the second half of the energy is delivered by two identical waves with one quarter of the total energy in each coming on transmission line 33 after reflection at its short-circuited distant end and on the two-step structure 30 with the transmission line 31.

By analogy with the circuit of FIG. 7b, to increase the separation between the sub-pulses above 3t, an additional matched transmission line 35 is inserted between the output of the two-step Darlington generator structure and the load 32. As illustrated in a further embodiment of the invention illustrated on FIG. 10a, an electrical length of the transmission line 36 is short-circuited at its distant end is increased by a time delay t1 relative to the transmission line 33 as illustrated in FIG. 9a. The resulting pulse on the load 32 initiated by closing switch 34 is illustrated on FIG. 10b.

Figure 10A:
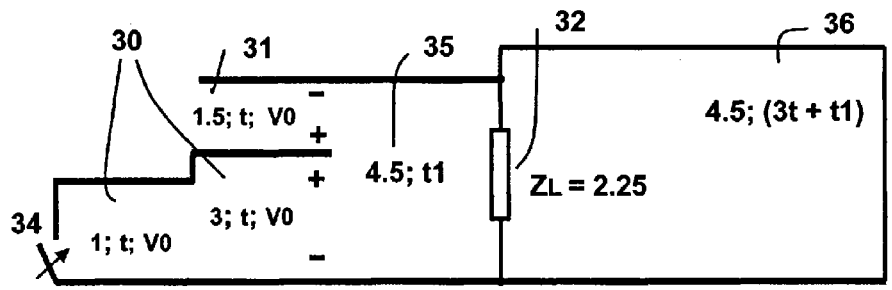
FIG. 10a depicts a schematic of a single-stage, two-step bipolar pulse generator with limited by 4t specified gap between sub-pulses according to an embodiment of the present invention.
Figure 10B:
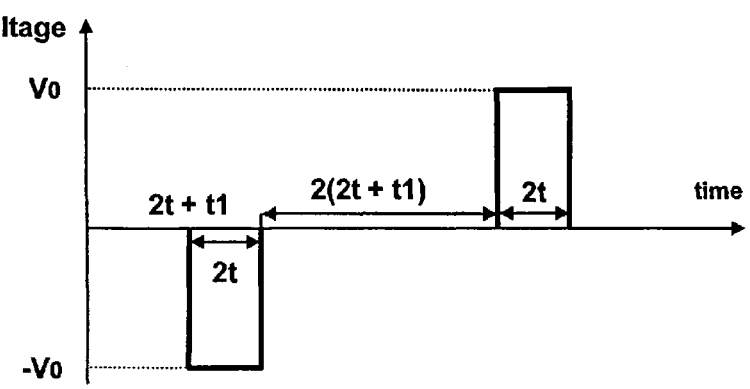
Figure 11A:
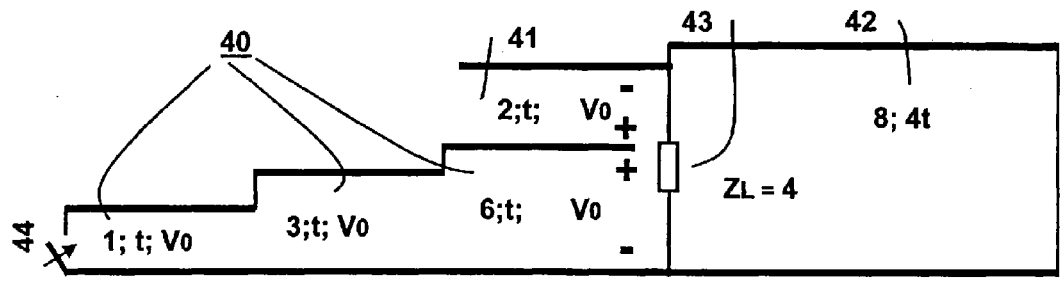
FIG. 11a depicts a schematic of a single-stage, three-step bipolar pulse generator with a gap between sub-pulses equal to the length of three sub-pulses according to an embodiment of the present invention.
Figure 11B:
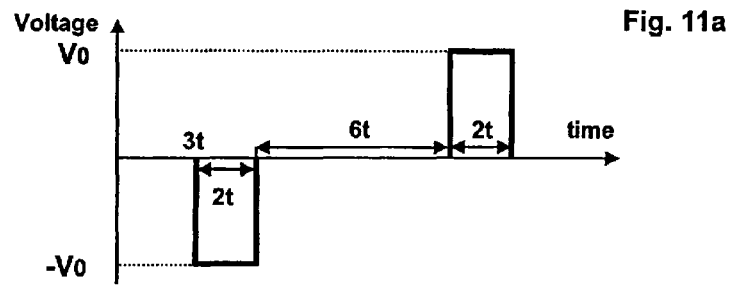

FIG. 11a depicts a single-stage (Darlington-type) three-step bipolar pulse generator in accordance with another embodiment of the present invention. It consists of three-step transmission line 40 with a switch 44 at its near end and a transmission line 41 that forms a transmission-line part of a Darlington generator, and an additional transmission line 42 connected to the load at its near end and short-circuited at its distal end. All characteristic impedances in three-step transmission line 40 and characteristic impedance of the transmission line 41 are the same as for a Darlington generator; however the impedance of load 43 is one half of that for a Darlington generator to achieve matching in full bipolar pulse generator including added the transmission line 42. The electrical length of the transmission line 42, by analogy with circuits FIG. 7a-FIG. 10a, is longer by a time delay t than the total electrical length (3t) of a three-step line Darlington's generator. The resulting pulse on the load 43 is illustrated on FIG. 11b.

The illustrated principle of creating bipolar pulse generators as shown in FIGS. 7a-11a, namely adding a transmission line (with specific characteristic impedance and time delay) connected to the load at its near end and short-circuited at its distal end, can be extended for any number of steps n and termed as a single stage, n-step bipolar pulse generator. For example, FIG. 12a that depicts a bipolar pulse generator according to a further embodiment of the present invention, in which an n-step transmission line 50 with transmission line 51 and switch 54 forms a charging structure of a Darlington pulse generator. An additional transmission line 52 is connected to the load 53 and short-circuited at its distant end, and provides a bipolar pulse with 2nt separation time between sub-pulses as illustrated on FIG. 12b. The electrical length of the transmission line 52 is equal to (n+1)t, where t is the electrical length of each step. The normalized values of step's characteristic impedances and load impedance related to the impedance of the first step are equal:

$$Z_i = i(i+1)/2, \text{ where } i=1,2,3,\ldots, \text{n number of steps} \quad (1)$$

$$Z_c = (n+1)/2 \quad (2)$$

$$Z_L = (n+1)^2/2 \quad (3)$$

$$Z_R = [(n+1)/2]^2 = Z_c^2 \quad (4)$$

It should be noted that equations (1) and (2) define a Darlington transmission line structure, while equations (3) and (4) give bipolar pulse with the gap between sub-pulses equal 2nt.

Figure 12A:
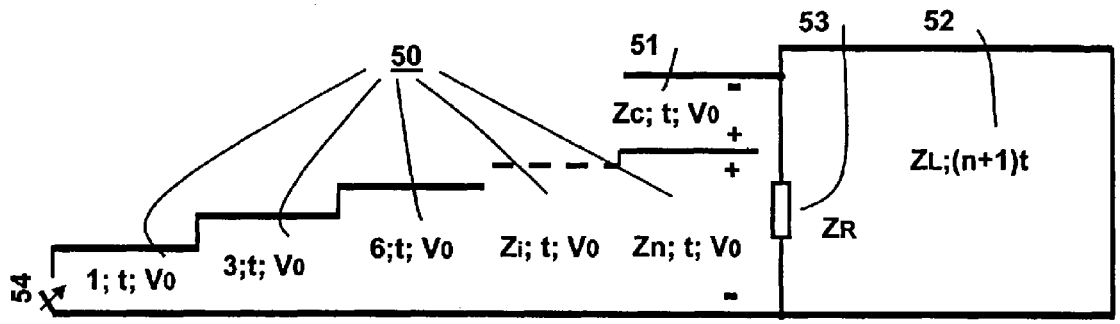
FIG. 12a depicts a schematic of a single-stage, n-step bipolar pulse generator with a gap between sub-pulses equal to the length of n sub-pulses (2nt) according to an embodiment of the present invention.
Figure 12B:
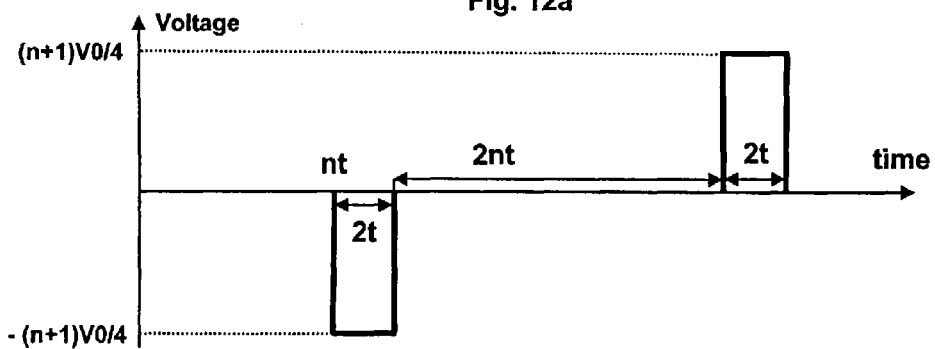

Referring to FIG. 13a, an n-step bipolar pulse generator according to another embodiment of the present invention, is shown in which an additional non-charged matched transmission line 55 with electrical length t1 is inserted between an output of charged structure (stepped line 50 with line 51) and the load 52 in a similar way as illustrated on FIG. 8a and FIG. 10a. The electrical length of transmission line 56 which is short-circuited at its distal end also should be increased by time t1 and equal to (n+1)t+t1. The resulting pulse on the load 52 activated by switch 54 is illustrated on FIG. 13b. Single-stage (Darlington-type), n-step bipolar pulse generators FIG. 12a provides increasing voltage/impedance transformation only by increasing the time delay between positive and negative sub-pulses.

FIG. 14 depicts a two-stage (s=2) bipolar pulse generator according to another embodiment of the present invention, in which a charged transmission line section 61 is a first stage and two followed charged steps 62 form a second stage. These two steps 62 with charged transmission lines 63, non-charged transmission line 66 and load 65 are defined by transformation of transmission lines 21, 24 and load 23 in the circuit of FIG. 7a. In this case, transformation in voltage/impedance is increased without changing the gap between sub-pulses, which is equal to the length of sub-pulse. The resulting pulse on the load 65 initiated by closing switch 64 is illustrated on FIG. 14b.

In all bipolar pulse generators according to embodiments of the present invention, the first stage is a Darlington n-stepped line (n≧1) that determines the gap between sub-pulses. This gap is equal to or exceeds (in the case of additional non-charged line between charged Darlington's structure and the load) the double transit time of Darlington's stepped line. All followed stages provide only voltage/impedance transformation.

Figure 15:
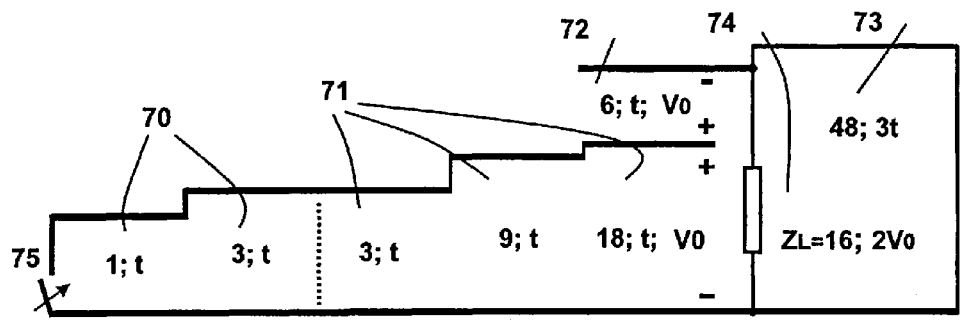
FIG. 15 depicts a schematic of two-stage bipolar pulse generator with a gap equal to the length of two sub-pulses according to an embodiment of the present invention.

FIG. 15 depicts a two-stage (s=2) bipolar pulse generator according to another embodiment of the present invention, in which the gap between sub-pulses equal to the length of two sub-pulses (g=2), which is similar to a single-stage generator according to FIG. 9a. In the referenced generator of FIG. 15, the first two-step stage 70, which determines the gap between sub-pulses (4t), is the same as the two-step line 30 in FIG. 9a. The values of elements of the second three-step stage 71, as well as elements 72, 73 and 74, are obtained by applying similar transformation (as in the circuit of FIG. 14) to elements 31, 32 and 33 of the circuit shown on FIG. 9a. As a result, a generator with the same gap as for initial circuit FIG. 9a provides voltage/impedance transformation, which is higher as compared to the ones for the generator illustrated in FIG. 9a.

Figure 16:
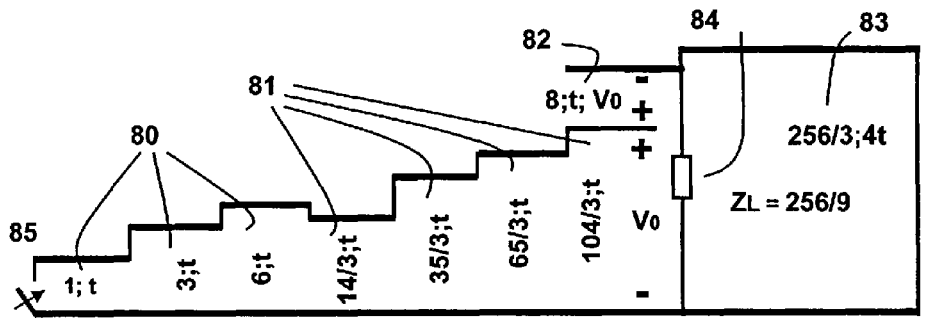
FIG. 16 depicts a schematic of two-stage bipolar pulse generator with a gap equal to the length of three sub-pulses according to an embodiment of the present invention.

FIG. 16 depicts a two-stage (s=2) bipolar pulse generator according to another embodiment of the present invention, in which the first three-step stage 80 that determines the gap between sub-pulses (6t) is the same as for the generator illustrated in FIG. 11a. Element's values of the second four-step stage 81 and the elements 82, 83 and 84 are obtained by applying (the same transformation as for circuit FIG. 14) to elements 41, 42 and 43 of circuit in FIG. 11a, i.e. to elements 51, 52 and 53 of circuit FIG. 12a, assuming n=3. In the resulting circuit shown in FIG. 16, the voltage/impedance transformation is increased as compared with the circuit in FIG. 11a.

Figure 17:
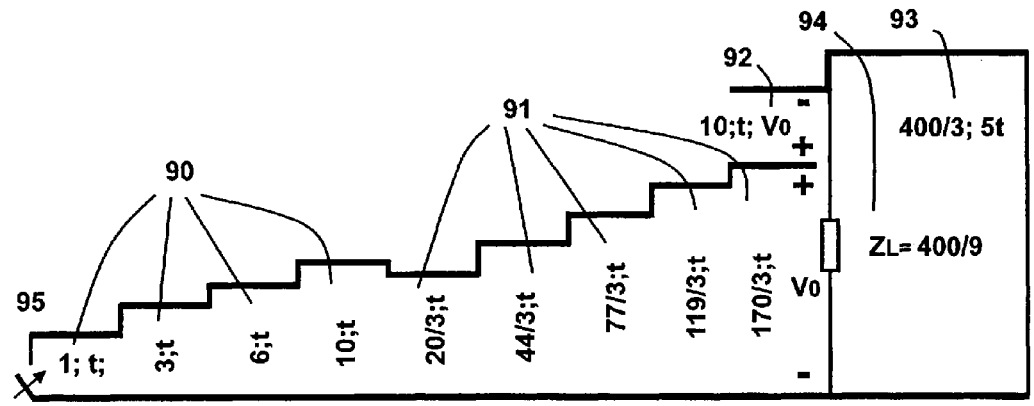
FIG. 17 depicts a schematic of two-stage bipolar pulse generator with a gap equal to the length of four sub-pulses according to an embodiment of the present invention.

FIG. 17 depicts another two-stage (s=2) bipolar pulse generator according to another embodiment of the present invention, in which a first four-step stage 90 is a Darlington-type four-step transmission line that determines the gap between sub-pulses, which is equal to the length of four sub-pulses, or to the double transit time of the first stage 90. Normalized characteristic impedances of steps in this stage are defined by equation (1). The impedances of five-step second stage 91 and impedances of transmission lines 92, 93 and load 94 are defined by applying as before circuit transformation to elements 51, 52 and 53 of circuit FIG. 12a for n=4. These three impedances are defined by equations (2), (3) and (4), assuming n=4 and the electrical length of line short-circuited at its distant end is equal to 5t.

Figure 18A:
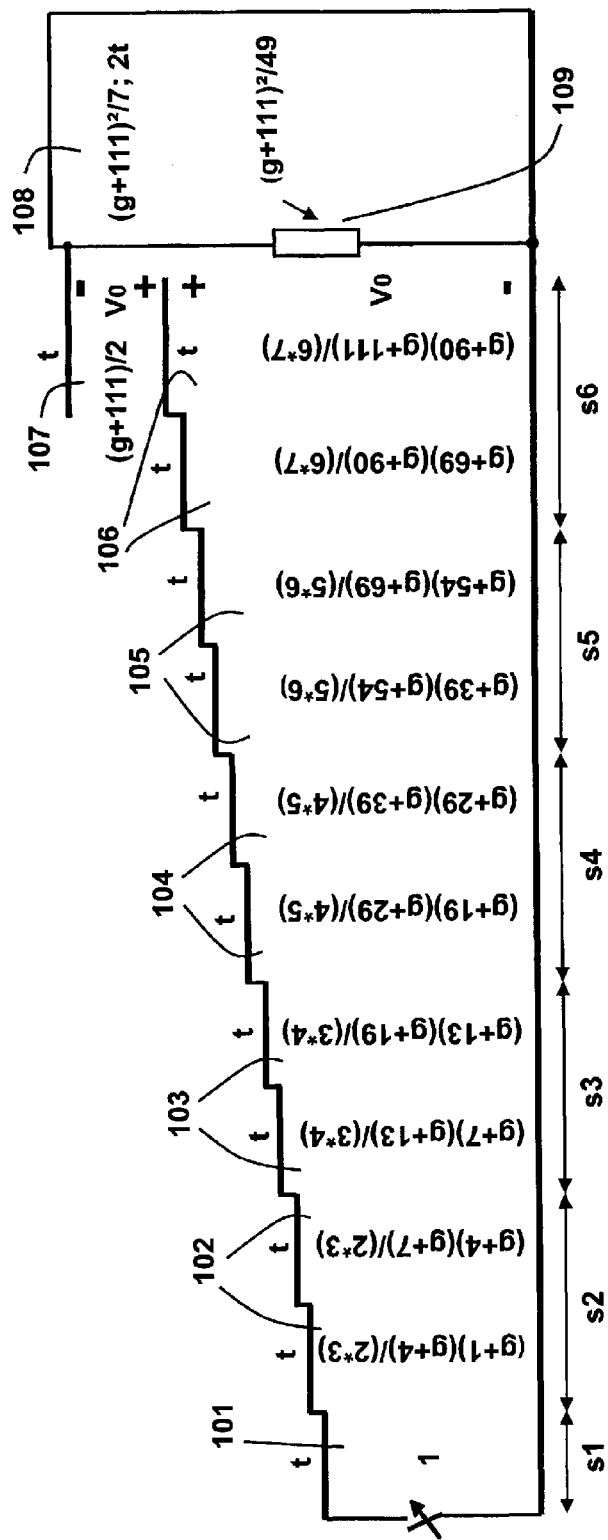
FIGS. 18a and 18b respectively depict a schematic of six-stage bipolar pulse generator with a gap equal to the length of sub-pulse according to an embodiment of the present invention and resulting waveforms.
Figure 18B:
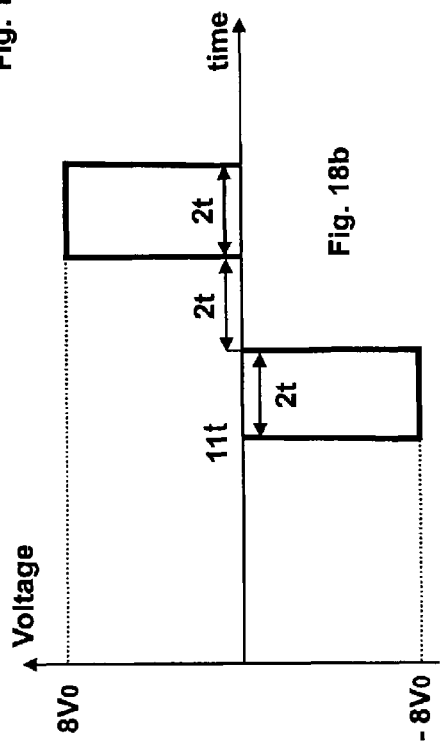

FIG. 18a depicts a six-stage (s=6) bipolar pulse generator according to another embodiment of the present invention, in which a single-step first stage 101 determines the gap between sub-pulses equal to the length of sub-pulse (double transit time of first stage 101). All followed five two-step stages 102, 103, 104, 105 and 106 provide impedance/voltage transformation. Characteristic impedances of all lines and impedance of a load 109 are presented in analytical form.

FIG. 19 depicts a two-stage (s=2) bipolar pulse generator according to another embodiment of the present invention, in which a first two-step stage 111 that determinates the gap between sub-pulses (4t) is a Darlington stepped line for n=2. Step impedances of a second three-step stage 112, the impedances of transmission lines 113, 114 and the impedance of load 115 are presented on FIG. 19 in analytical form.

FIG. 20a depicts a four-stage 120 (s=4) bipolar pulse generator according to another embodiment of the present invention, in which a first two-step stage is the same as in FIG. 19 that determinates the same gap between sub-pulses (4t). Step impedances of all the following three stages and the impedances of transmission lines 121, 122 and the impedance of load 123 are presented in FIG. 20a in analytical form.

FIG. 21 depicts a two-stage 130 (s=2) bipolar pulse generator according to another embodiment of the present invention, in which a first three-step stage determines the gap between sub-pulses equal 6t. Four step impedances of the second stage and the impedances of transmission lines 131, 132 and the impedance of load 133 are presented in analytical form.

FIG. 22 depicts a three-stage 140 (s=3) bipolar pulse generator according to another embodiment of the present invention, in which a first three-step stage determines the same gap between sub-pulses (6t) as for the generator according to that shown in FIG. 21. All step impedances of the next two stages and the impedances of transmission lines 141, 142 and the impedance of load 143 are presented in analytical form.

FIG. 23 depicts a two-stage 150 (s=2) bipolar pulse generator according to another embodiment of the present invention, in which a first four-step stage determines the gap between sub-pulses (8t) as a double transit time of this stage.

All step impedances of the next stage and the impedances of transmission lines 151, 152 and the impedance of load 153 are presented in analytical form.

FIG. 24 depicts a three-stage 160 (s=3) bipolar pulse generator according to another embodiment of the present invention, in which a first four-step stage is the same as for the generator shown in FIG. 23 and determines the same gap (8t) between sub-pulses. All step impedances of the next two stages and the impedances of transmission lines 161, 162 and the impedance of load 163 are presented in analytical form FIG. 25 is a table of normalized characteristic impedances of transmission lines and load impedances in analytical form for all combinations of gaps between sub-pulses (g=1, 2, 3, 4) relative to the length of sub-pulse and number of stages s=1, 2, 3, 4, 5, 6.

FIG. 26 is a table of normalized characteristic impedances of transmission lines and load impedances in analytical form for all combinations of gaps between sub-pulses (g=1, 2, 3, 4) relative to the length of sub-pulse and number of stages s=7, 8, 9, 10, 11.

FIG. 27 is a table of normalized characteristic impedances of transmission lines and load impedances in analytical form for all combinations of gaps between sub-pulses (g=5, 6) relative to the length of sub-pulse and number of stages s=1, 2, 3, 4, 5, 6.

The tables illustrate the principle of determination of all impedances for any given numbers g and s for a bipolar pulse generators according to an embodiment of the present invention.

The invention has been described with reference to certain preferred embodiments thereof. It will be understood, however, that modifications and variations are possible within the scope of the appended claims.

What is claimed is:

1. A bipolar pulse generator comprising:
a first transmission line structure including a switch;
a second transmission line structure;
a load coupled between the first transmission line structure and the second transmission line structure;
a voltage source that charges the first transmission line structure when the switch is in the open state; and
wherein the load is coupled between the first transmission line structure and the second transmission line structure at a load location such that a pulse including a gap between a negative sub-pulse and a positive sub-pulse is generated when the switch is in the closed state.

2. A bipolar pulse generator as claimed in claim 1, wherein the first transmission line structure includes a first transmission line, the second transmission line structure includes a second transmission line connected to a third transmission line and the load is positioned between the second transmission line and the third transmission line.

3. A bipolar pulse generator as claimed in claim 2, wherein the first, second and third transmission lines are each two conductor transmission lines.

4. A bipolar pulse generator as claimed in claim 2, wherein the distal end of the first transmission line is coupled to the near end of the second transmission line through the switch, the distal end of the second transmission line is coupled to the load, the near end of the third transmission line is coupled to the load and the distal end of the third transmission line is short-circuited.

5. The bipolar pulse generator according to claim 1, wherein the first transmission line structure comprises a three conductor transmission line structure and the second transmission line structure comprises a two conductor transmission line structure.

6. The bipolar pulse generator according to claim 5, wherein the three conductor transmission line structure includes a first conductor, a second conductor and a central conductor, wherein the first conductor and the central conductor comprises a first transmission line and the second conductor and the central conductor comprises a second transmission line, and wherein the switch is provided between first conductor and the central conductor of the first transmission line at a near end thereof.

7. The bipolar pulse generator according to claim 6, wherein a distal end of the three conductor first transmission line structure is coupled to the load, wherein the load is connected to the near end of the second transmission line structure, which is a two-conductor transmission line short-circuited at its distal end.

8. The bipolar pulse generator according to claim 6, wherein the voltage source charges the first transmission line and the second transmission line to opposite polarities.

9. A bipolar pulse generator as claimed in claim 6, wherein the second transmission structure includes a third transmission line cascade connected to a fourth transmission line and the load is positioned between the third transmission line and the fourth transmission line.

10. The bipolar pulse generator according to claim 9, wherein a distal end of the fourth transmission line is short-circuited.

11. The bipolar pulse generator according to claim 6, wherein the first transmission line is a multi-step transmission line including n steps.

12. The bipolar pulse generator according to claim 11, wherein the positive sub-pulse and the negative sub-pulse are of equal length, and the gap between the positive sub-pulse and negative sub-pulse is the equal to n times the length of the positive sub-pulse or the negative sub-pulse.

13. The bipolar pulse generator as claimed in claim 11, wherein the second transmission structure includes a third transmission line cascade connected to a fourth transmission line and the load is positioned between the third transmission line and the fourth transmission line.

14. The bipolar pulse generator according to claim 13, wherein a distal end of the fourth transmission line is short-circuited.

15. The bipolar pulse generator according to claim 11, wherein the stepped transmission line includes two steps.

16. The bipolar pulse generator according to claim 11, wherein the stepped transmission line includes three steps.

17. The bipolar pulse generator according to claim 11, wherein the impedance of each successive step increases.

18. The bipolar pulse generator according to claim 11, wherein the electrical length of the fourth transmission line is n+1 times the electrical length of each step of the first transmission line.

19. The bipolar pulse generator according to claim 5, wherein the load location is such that the positive sub-pulse and the negative sub-pulse are of equal length, and the gap between the positive sub-pulse and the negative sub-pulse is the same length as the length of positive sub-pulse and the negative sub-pulse.

* * * * *